United States Patent [19]

Dragone

[11] Patent Number: 4,607,259

[45] Date of Patent: Aug. 19, 1986

[54] ADAPTIVE ANTENNA FOR REDUCING MULTIPATH FADES

[75] Inventor: Corrado Dragone, Little Silver, N.J.

[73] Assignee: AT&T Bell Laboratories, Murray Hill, N.J.

[21] Appl. No.: 664,523

[22] Filed: Oct. 25, 1984

[51] Int. Cl.[4] .......................... H10Q 3/02; G01S 5/02

[52] U.S. Cl. .................................... 343/758; 343/421; 343/781 P; 343/778

[58] Field of Search ............ 343/758, 781 P, 781 CA, 343/839, 778, 359, 421

[56] References Cited

U.S. PATENT DOCUMENTS

| | | | |
|---|---|---|---|
| 3,378,844 | 4/1968 | Zurcher | 343/16 R |
| 4,197,542 | 4/1980 | Hofgen | 343/398 |
| 4,257,048 | 3/1981 | Yokoi et al. | 343/709 |
| 4,425,566 | 1/1984 | Dragone | 343/781 |

OTHER PUBLICATIONS

Electronic Letters, vol. 7, No. 13, Jul. 1, 1971, Parsons et al., pp. 380–381.

IEEE International Radar Conf., Apr. 21–23, 1975, Arlington, Va., Nessmith et al., pp. 354–359.

Microwave Jrnl., vol. 19, No. 6, Jun. 1976, Willwerth et al., pp. 37–39.

Radar–82, Oct. 18–20, 1982, London, Great Britain, Muto et al., pp. 225–229.

*Primary Examiner*—Eli Lieberman

*Attorney, Agent, or Firm*—Erwin W. Pfeifle

[57] ABSTRACT

The present invention relates to an antenna arrangement for reducing multipath fades. The antenna arrangement comprises a curved main reflector disposed confocally with one focal point of a subreflector, and a feed arrangement. The feed arrangement comprises at least a pair of feed horns and a selectively movable plate reflector disposed between the feed horns and the subreflector along a feed axis of the antenna arrangement. The feed horns are disposed adjacent each other with the aperture of each of two feed horns covering one-half of the image of the main reflector. By selectively orienting the plate reflector so that one of the two multipath beams arrives with its central ray disposed orthogonal to the aperture of the feed horns, the contribution from each half of this beam received at each feed horn, for a particular frequency band, is equal and can be subtracted from the other half beam signal to cancel its effect without the need for an equalizer.

4 Claims, 6 Drawing Figures

ADAPTIVE ANTENNA FOR REDUCING MULTIPATH FADES

TECHNICAL FIELD

The present invention relates to an adaptive antenna arrangement for reducing multipath fades and, more particularly to an adaptive antenna arrangement comprising a main curved reflector and a feed arrangement including a selectively movable plate reflector and a pair of adjacent feed horns disposed to cover the image of the main reflector. The plate reflector is selectively movable to cause a central ray of one of two concurrently received multipath beams to arrive orthogonal to the aperture of the pair of feed horns and thereby permit simple cancellation of that beam's signals to the output of the pair of feed horns.

DESCRIPTION OF THE PRIOR ART

Multipath propagation during anomalous atmospheric conditions can cause an output signal of a receiving antenna to be practically zero for seconds at a time. Such fades are often caused by two interfering rays, having approximately the same amplitude, but opposite phase, causing the incident distribution over the receiving aperture of the antenna to have a net value of zero.

Multipath fades have been overcome to some extent by the use of two diversity antennas which are physically separated by a predetermined distance so that when a fade condition affects one antenna, the other antenna will not be concurrently affected by the fade condition. Such arrangements are well known in the art.

Various other techniques have also been developed to overcome fade conditions. One such technique is disclosed in U.S. Pat. No. 4,257,048 issued to H. Yokoi et al on Mar. 17, 1981. There, an antenna system is disclosed including a single directional antenna having a single directional gain pattern for receiving electromagnetic waves in a certain direction. The orientation of the directional gain pattern can be changed to vary the gain of the antenna in directions other than the certain direction in which electromagnetic waves are to be received, thereby reducing the amplitude of received undesired waves.

Another technique for multipath compensation is to use an array. In this regard see, for example, U.S. Pat. No. 4,197,542 issued to G. Hofgen on Apr. 8, 1980, which discloses a circular array antenna and switch programming of at least one discrete set of phase shifters to effect changed phase-rotation fields; and the article "Array Aperture Sampling Technique For Multipath Compensation" by F. G. Willwerth et al in *Microwave Journal,* Vol. 19, No. 6, June 1976 at pages 37–39 where a long aperture linear array is electronically stabilized.

The above described techniques, however, require one or more antennas and associated circuitry for compensating for multipath fades. More particularly, the use of an array or multiple antennas is not attractive since each antenna (usually a horn reflector) is connected to a receiver through a long waveguide run and, therefore, cost and complexity rapidly increase with an increase in the number of antennas or elements. Additionally, a disadvantage of a matched array is that such array requires an adaptive equalizer at the output if the two rays are characterized by appreciably different delays. The problem, therefore, remaining in the prior art is to provide a simple and inexpensive antenna arrangement for use in overcoming multipath fades.

SUMMARY OF THE INVENTION

The foregoing problem in the prior art has beens solved in accordance with the present invention which relates to an adaptive antenna arrangement for reducing multipath fades. More particularly, the present adaptive antenna arrangement comprises a main curved reflector and a feed arrangement including a selectively movable plate reflector and a pair of adjacent feed horns disposed to cover an image of the main reflector. The plate reflector is selectively movable to cause a central ray of one of two concurrently received multipath beams to arrive orthogonal to the aperture of the pair of feed horns and thereby permit simple cancellation of that beam's received signals at the output of the pair of feed horns.

Other and further aspects of the present invention will become apparent during the course of the following description and by reference to the accompanying drawings.

BRIEF DESCRIPTION OF THE DRAWINGS

Referring now to the drawings in which like numerals represent like parts in the several views.

DETAILED DESCRIPTION

Figure 1:
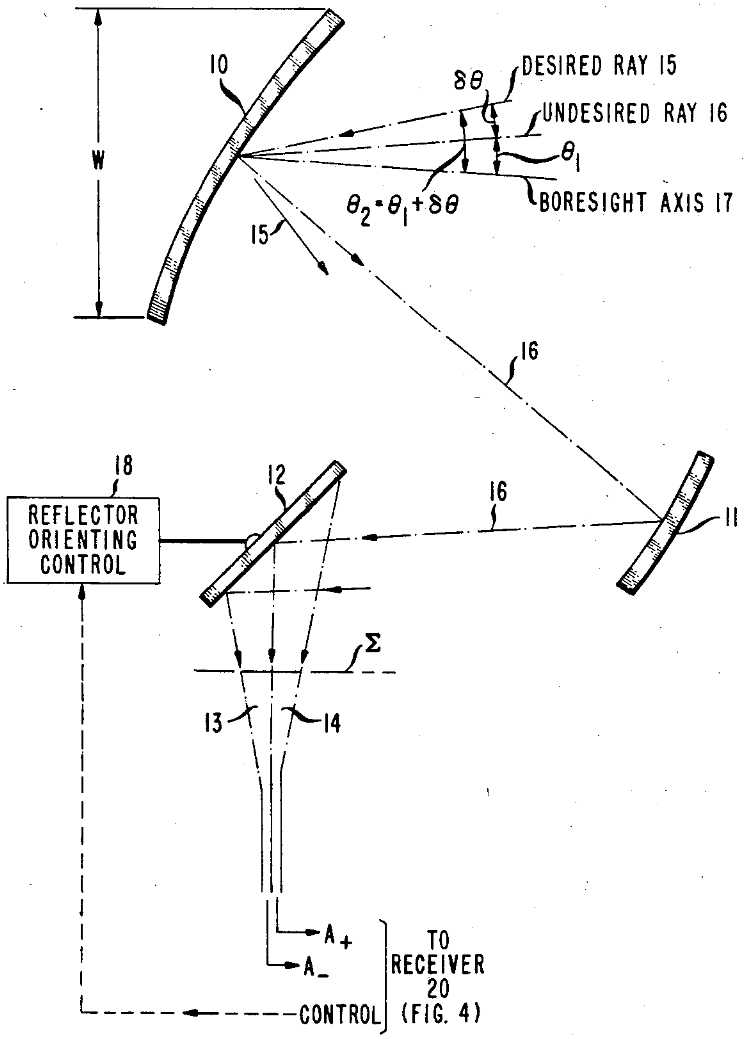
FIG. 1 is a side cross-sectional view of an exemplary antenna arrangement in accordance with the present invention.

An antenna arrangement for reducing multipath fading in accordance with the present invention is shown in FIG. 1. The present antenna arrangement comprises a main focusing reflector 10, with a width W, and a subreflector 11 disposed in an imaging configuration similar to that shown in U.S. Pat. No. 4,425,566 issued to C. Dragone on Jan. 10, 1984. More particularly, reflectors 10 and 11 are disposed confocally to each other to produce an image of the reflecting surface of main reflector 10 on an image surface Σ of the combined reflector arrangement. The antenna arrangement further includes a feed arrangement comprising a selectively movable plate reflector 12 and at least a pair of feed horns 13 and 14. For purposes of simplicity in understanding the present invention hereinafter, only a first and a second feed horn 13 and 14 will be used. The apertures of feed horns 13 and 14 are disposed adjacent each other and on the image surface Σ of main reflector 12 so that each aperture covers a separate one-half of the overall image of main reflector 10.

It is to be understood that most fades can be adequately described by considering only two rays, a first desired ray 15, e.g., a direct ray, of a first beam and a second undesired ray 16, e.g., a refracted ray, of a second beam as shown in FIG. 1, where both beams carry the same information over separate paths from a remote transmitter. At main reflector 10, $\theta_1$ denotes the angle between the boresight axis 17 of the antenna arrangement and the reflected ray of undesired ray 16; $\delta\theta$ denotes the angle between the reflected desired and undesired ray; and $\theta_2=\theta_1+\delta\theta$ denotes the angle between the boresight axis 17 and reflected desired ray 15.

Figure 2:
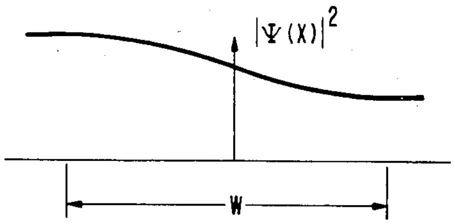
FIG. 2 is a curve of an exemplary incident power density or illumination distribution over the aperture of the antenna arrangement of FIG. 1 during multipath fading.

As was stated hereinabove, the aperture of main reflector 10 is divided into two parts and illuminated respectively by the images of the apertures of the two feed horns 13 and 14. Under a non-fade condition, the amplitude $a_1$ of undesired ray 16 is zero and the antenna beam direction can be varied in elevation by rotating plate reflector 12 via a reflector orienting control means 18. Reflector orienting control means 18 can comprise any suitable arrangement as, for example, a manual device or an automatic device such as a solenoid operated via control signals from a controller. During multipath fading, however, the antenna aperture is illuminated by several rays, e.g., 15 and 16, with different delays, producing over the aperture an amplitude variation, $\psi(X)$, as shown, for example, in FIG. 2. It is to be understood that rays 15 or 16 are central rays of separate beams propagating over different paths carrying the same signal, which signal can, for example, be a broadband signal comprising a predetermined frequency band including one channel or many multiplexed channel signals.

In accordance with the present invention, by orienting plate reflector 12 during a fade condition to cause a central ray from one of the two multibeams, e.g., ray 16, to arrive orthogonal to the aperture of feed horns 13 and 14, then the planar wavefronts associated with that beam arrive essentially parallel to the aperture of the feed horns 13 and 14 and that beam's contribution to each half of the received signal will essentially be equal for a particular frequency band and can be easily cancelled at the outputs of feed horns 13 and 14 by simple subtraction of the two output signals. Because of the capability to remove the contributions of one of the two multibeams, the contributions of only one beam remain, and it is then possible to avoid the use of equalizers for such frequency band at an associated receiver.

When the amplitude of the beam associated with refracted or undesired ray 16 is small, the outputs $A_+$ and $A_-$ of the two feeds 14 and 13, respectively, can be combined in phase with a result that the sum $(A_++A_-)$ of the output signals from feed horns 13 and 14 is maximized by orienting plate reflector 12 so that the antenna beam direction corresponds to the desired ray 15. However, during a deep fade, the difference $(A_+-A_-)$ of the output signals from feed horns 13 and 14 can be generated at the output of the feed horns and plate reflector 12 oriented so as to produce a null in the direction of undesired ray 16. The null direction is frequency-independent, and the orientation of plate reflector 12 can be determined by the frequency-dependence of $(A_++A_-)$ and $(A_+-A_-)$.

In the arrangement of FIG. 1, it will be assumed that $\sigma\gamma$ (not shown) is the angle specifying the orientation of plate reflector 12 with respect to a given reference position. With $A_+$ and $A_-$ being the outputs of the two feeds 14 and 13, respectively, and plate reflector 12 being oriented in the direction of the undesired or refracted ray 16 of an amplitude "a" so that the component of $A_++A_-$, corresponding to ray 16, is maximized, then taking the difference $(A_+-A_-)$ for this particular orientation of reflector 12 results in the difference output $(A_+-A_-)$ being independent of the value of a, $\phi$, which result is not generally found for matched arrays including many elements.

Figure 3:
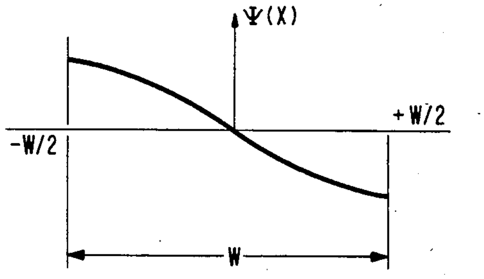
FIG. 3 is a curve of an exemplary aperture distribution over the antenna arrangement of FIG. 1.

This simple result is illustrated by FIG. 3 showing the aperture distribution $\psi(x)$ for the combined multipath signals over the antenna aperture W of FIG. 1 for small values of $\theta_1$, $\theta_2$, assuming a $\sim 1$ and $\phi=\pi$ which corresponds to a deep fade condition. In FIG. 3, the distribution $\psi(x)$ is shown as having essentially, for small values of $\theta_1$, $\theta_2$, uniform phase over either one of the two intervals $0<x<+W/2$ and $-W/2<x<0$. Decomposing $\psi$ into two parts, corresponding to the above-mentioned two intervals, $\psi=\psi_+-\psi_-$, where $\psi_+=0$ for $x<0$ and $\psi_-=0$ for $x>0$. It should be noted that the outputs of the two feed horns 13 and 14 must be combined with a phase difference of 180 degrees because of the difference in sign in the above equation for $\psi$. Similar conditions apply when more than two rays are involved, in which case more than two horns may have to be used, but most fades are adquately described by only two rays. To determine the required value of $\delta\gamma$, which specifies the plate reflector 12 orientation, requires a knowledge of the angles of arrival $\theta_1$, $\theta_2$ associated with the two rays 15 and 16.

If the two rays 15 and 16 are characterized by appreciably different delays such that the path length difference is much greater than 180 degrees, then $\theta_1$, $\theta_2$ can be determined from a measurement of the frequency-dependence of $A_++A_-$ and $A_+-A_-$. The reason for this is best understood by supposing that a pulse is sent by a remote transmitting antenna via the multipath route, then, since the path length difference is much greater than 180 degrees, it implies that the two pulses propagating along the two different paths will be received at different times $t_1$ and $t_2$, and that the received pulses determines the values of $\theta_1$ and $\theta_2$, as specified by the received values of $$\frac{A_+ - A_-}{A_+ + A_-} \text{ at } t = \tau_1,\tau_2.$$

The same argument applies if more than two rays or multipaths are involved, providing the differences $l_1-l_2$, $l_1-l_3$, etc. between their path lengths are all appreciably different.

The above argument also remains valid if, instead of measuring $A_+$, $A_-$ in the time domain, the variations of $A_+-A_-$ and $A_++A_-$ are measured in the frequency domain. In general, a knowledge of the frequency response also implies a knowledge of the impulse response since one is the Fourier transform of the other. To illustrate the argument for the frequency domain, let $\theta_1$, $\theta_2$ be small. Then to a first approximation $A_++A_-$ is proportional to $1+ae^{j\phi}$, where $\phi$ is determined from the path length difference, and $A_+-A_-$ is proportional to $\theta_1+ae^{j\phi}\theta_2$. At the frequency at which $|A_++A_-|$ is maximum, $A_++A_-$ is proportional to $1+a$ and $A_+-A_-$ is proportional to $\theta_1+a\theta_2$. When $A_++A_-$ is minimum, then $A_{30}+A_-$ is proportional to $1-a$ and $A_+-A_-$ is proportional to $\theta_1-a\theta_2$. From the value $1+a/1-a$, "a" can be determined, and from the values $$\frac{\theta_1 \pm a\theta_2}{1 \pm a},$$

one can determine $\theta_1$, $\theta_2$.

Figure 4:
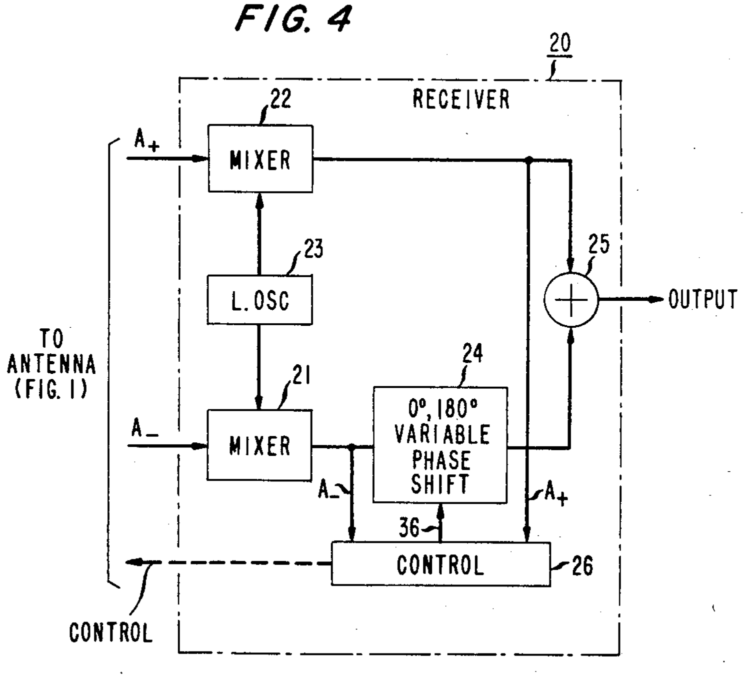
FIG. 4 is a block diagram of an exemplary receiver portion for obtaining an output signal where the contribution from one multibeam is cancelled and a control signal is generated to properly orient the plate reflector of FIG. 1.

An exemplary receiver 20 for processing the received $A_+$ and $A_-$ signals from feed horns 13 and 14 is shown in FIG. 4. The signals received from each half of main reflector 10 at feed horns 13 and 14 are transmitted to a receiver 20 which comprises a first and a second mixer 21 and 22 for receiving the signals from feed horns 13 and 14, respectively. The received signals $A_-$ and $A_+$ are mixed in mixers 21 and 22, respectively, with a predetermined frequency generated by a local oscillator 23 to provide a separate output signal. The output signal from one of the mixers, e.g., mixer 21 as shown in FIG. 1, is phase shifted by 0 degrees under conditions of no deep fade and is phase shifted by 180 degrees for a deep fade where "a" is close to unity in variable phase shifter 24 in response to control signals from controller 26, with the output from variable phase shifter 24 being added to the output from mixer 22 in adder 25 to provide the receiver 20 output signal. The receiver 20 output signal provides close to a maximum power output by the cancellation of the contributions of one of the multipath beams and avoids the use of equalizers to perform such function. It is to be understood that appropriate amplification of the signals $A_+$ and $A_-$ from the antenna and appropriate filtering at the output of mixers 21 and 22 may be required and should be provided as needed even though such circuits are not shown in FIG. 4.

The outputs of mixers 21 and 22 are also transmitted to a control circuit 26 which uses the $A_+$ and $A_-$ signals to calculate "a" and $\theta_1$ and $\theta_2$ as explained hereinabove and then to provide an appropriate control signal (CONT) to reflector orientation control 18 in FIG. 1 and variable phase shifter 24 in FIG. 4. Orientation control 18, in response to the control signal from control 26, orients plate reflector 12 to dispose one of the central rays (15 or 16) of the incoming multipath beams orthogonal to the aperture of feed horns 13 and 14. It is to be understood that control 26 can continuously calculate the fade condition and the angles of arrival of the two beams and update its control signal to both variable phase shifter 24 and reflector orientation control 18, if changes are required due to changing fade or non-fade conditions.

Figure 5:
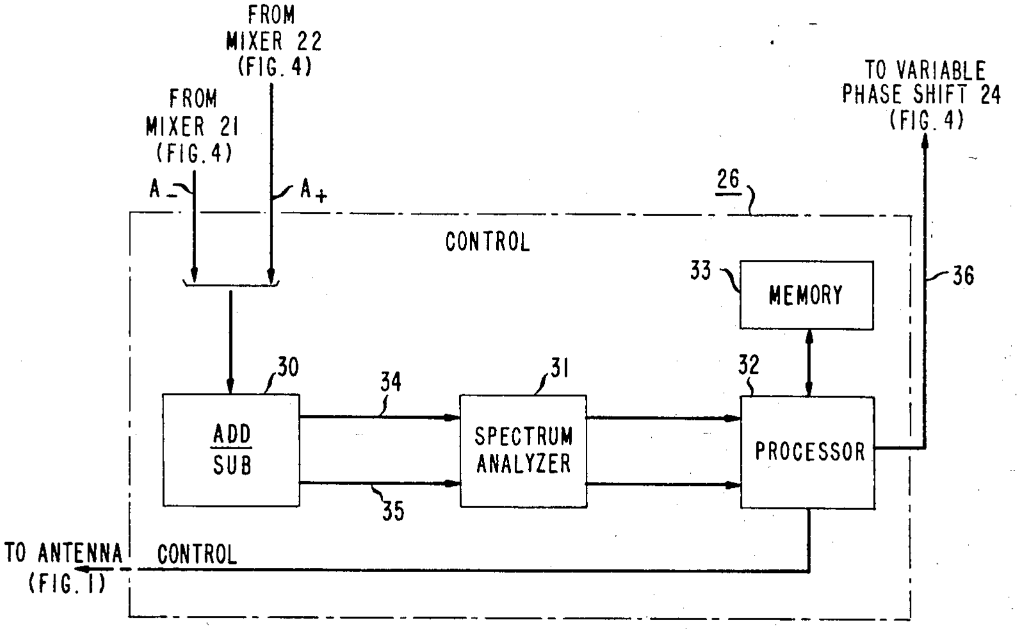
FIG. 5 is an exemplary block diagram of a control means for use in the arrangement of FIG. 4.
Figure 6:
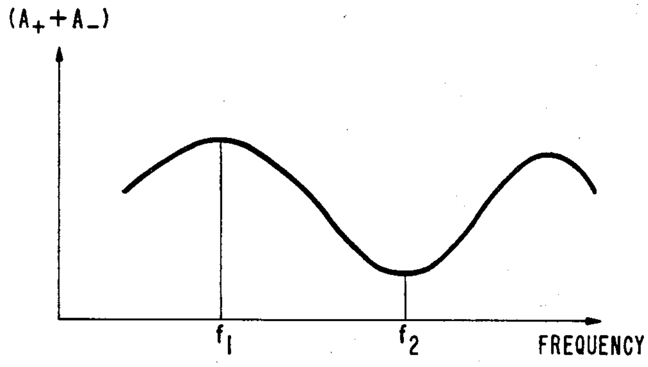
FIG. 6 is an exemplary curve of the amplitude of the combined signal $A_+ + A_-$ versus frequency as might be found at the output of the addition section in the control arrangement of FIG. 5.

An exemplary arrangement for control circuit 26 is shown in FIG. 5, where the input signals from mixers 21 and 22 are received in an addition and subtraction means 30. The adder section adds the two signals to provide a first output signal $(A_+ + A_-)$ on lead 34. The subtraction section subtracts the two signals to provide a second output signal $(A_+ - A_-)$ on lead 35. An exemplary curve of the first output signal versus frequency is shown in FIG. 6 and it is to be understood that a similar curve is obtained for the second output signal. The first and second output signals from addition and subtraction means 30 are received in a spectrum analyzing means 31.

Spectrum analyzing means 31 functions to analyze various frequencies within the spectrum of each of the two input signals to determine the frequency with the maximum amplitude ($f_1$) and the frequency with the minimum amplitude ($f_2$) of each signal as shown in FIG. 6 for the first output signal. The minimum and maximum frequencies of each signal $(A_+ + A_-)$ and $(A_+ - A_-)$ and the amplitudes of the signals at such frequencies is provided to a processor 32 and stored in its memory 33.

Processor 32 functions to determine the value "a" from 1+a/1−a, as was described hereinbefore, from the maximum and minimum frequencies of a particular output signal from spectrum analyzer means 31. From the value of "a", processor 32 can direct an appropriate control signal to variable phase shifter 24 over lead 36 to provide the appropriate 0 or 180 degree phase shift. Processor 32 then can determine $\theta_1$ and $\theta_2$ for each of the maximum and minimum frequencies of the two signals as was also described hereinbefore. Having determined the angles of incidence, processor 32 can then determine the proper control signal for transmission to reflector orienting control 18 for properly positioning plate reflector 12. It is to be understood that the arrangement of control means 26 of FIG. 5 is provided for purposes of exposition and not for purposes of limitation. Any other suitable arrangement which will provide the signals for determining the maximum and minimum frequencies of each signal (e.g., filters which pass different frequencies, analog-to-digital converters, and comparators in sequence) and for determining the angles of incidence to provide a proper control signal can be used. It is to be further understood that processor 32 can comprise a microprocessor with the associated memory 33 for storing the received data and the program for computing the angles of incidence and the proper control signal to be transmitted.

What is claimed is:

1. An antenna arrangement comprising:

a main curved focusing reflector including a focal point and a predetermined aperture for converting a planar wavefront at the aperture into a spherical wavefront focused at the focal point;

a subreflector comprising a first focal point disposed confocally with the focal point of the main reflector for transforming a spherical wavefront from the first focal point into a separate wavefront focused at a second focal point of the subreflector; and a feed arrangement comprising:

a plurality of N feed horns, each feed horn including an aperture disposed at an image of the main reflector and covering a different 1/N portion of said image, and a selectively movable flat reflector disposed between the subreflector and the feed horns along a feed axis of the antenna arrangement and capable of directing one of a plurality of beams arriving from different directions at the aperture of the main reflector such that a central ray of said one of the plurality of beams is oriented substantially orthogonal to the apertures of the plurality of N feed horns.

2. An antenna arrangement according to claim 1 wherein the value of N is equal to 2.

3. An antenna arrangement according to claim 1 wherein the feed arrangement further comprises:

orienting control means for orienting the selectively movable reflector in a desired orientation in response to control signals designating said desired orientation.

4. An antenna arrangement according to claim 3 wherein N is equal to 2 and the antenna arrangement further comprises:

a signal receiver comprising means responsive to concurrently received signals from each of the plurality of N feed horns for determining therefrom an angle of incidence of a central ray of each of two multipath beams on the main reflector and generating therefrom an appropriate control signal to the orienting control means for selectively orienting the reflector of the feed arrangement so that one of the two multipath beams has a central ray thereof oriented substantially orthogonal to the aperture of the plurality of N feed horns.

* * * * *